United States Patent
Young

(10) Patent No.: US 6,529,004 B1
(45) Date of Patent: Mar. 4, 2003

(54) MAGNETIC RESONANCE IMAGING APPARATUS

(75) Inventor: Ian Robert Young, Marlborough (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 42 days.

(21) Appl. No.: 09/587,575

(22) Filed: Jun. 5, 2000

(30) Foreign Application Priority Data

Jun. 4, 1999 (GB) .............................................. 9912922

(51) Int. Cl.[7] ................................................. G01V 3/00
(52) U.S. Cl. ........................ 324/318; 324/309; 600/422
(58) Field of Search ................................ 600/422, 415; 324/318, 722, 309, 320, 321, 319, 307

(56) References Cited

U.S. PATENT DOCUMENTS

| 5,085,219 A | * | 2/1992 | Ortendahl et al. ........... 600/422 |
| 5,177,441 A | | 1/1993 | Morich ......................... 324/318 |
| 5,197,474 A | | 3/1993 | Englund et al. ............. 600/415 |
| 5,477,146 A | | 12/1995 | Jones ........................... 324/318 |
| 5,552,707 A | | 9/1996 | Takahashi et al. ........... 324/318 |
| 5,706,813 A | * | 1/1998 | Filler et al. ................... 600/422 |

FOREIGN PATENT DOCUMENTS

| EP | 0 654 675 A1 | 5/1995 |
| EP | 0 698 796 A1 | 2/1996 |

OTHER PUBLICATIONS

P.B. Roemer, et al.; "The NMR Phased Array"; *Magnetic Resonance In Medicine 16*, pp. 192–225 (1990).

* cited by examiner

*Primary Examiner*—Edward Lefkowitz
*Assistant Examiner*—Tiffany A. Fetzner
(74) *Attorney, Agent, or Firm*—Thomas M. Lundin

(57) ABSTRACT

A magnetic resonance imaging apparatus has a patient support (1) moveable on runners (2) along a beam (3) into a bore (4). The r.f. coil (7) is secured to the patient support so as to travel axially with the patient support when the patient enters the bore. The r.f. coil is also moveable laterally to enable off-centre as well as central regions of the patient to be imaged. The apparatus is particularly suited to continuous scan. The width of the central section of the coil (7) may also be variable in a lateral direction to accommodate patients of different size.

20 Claims, 2 Drawing Sheets

MAGNETIC RESONANCE IMAGING APPARATUS

BACKGROUND

This invention relates to magnetic resonance (MR) imaging apparatus.

Magnetic resonance is excited in MR active nuclei, such as protons of hydrogen atoms, by applying an r.f. excitation pulse in the presence of a powerful magnetic field. The resulting r.f. signals emitted by the nuclei, in the presence of suitable spatial coding of the magnetic field, provide data about the distribution of these nuclei and hence of tissue and fluids in the patient being imaged.

One way of achieving the high magnetic fields necessary to enable resonance to be excited is by using an electromagnet in the form of a coil, either resistive, or more usually superconducting. The patient is slid into the bore of such a magnet.

A typical arrangement is shown schematically in FIG. 1. A patient support 1 is moveable on runners 2 on a beam 3 into and out of the bore 4 of an electromagnet. Coils for producing the main magnetic field are contained in the casing 5 (not shown to scale) surrounding the bore 4, as are coils for producing magnetic field gradients for spatially encoding the part of the patient which lies within the excitation region.

For a given number of turns and current, the field strength along the axis of a coil decreases as the diameter of the coil is increased. This decrease of field could be offset by increasing the current through the coil, but with the penalty of increased cost of the magnet. Accordingly, there is always a conflict between desired minimum bore size and the cost of the magnet. It follows that care is always taken to utilise the full diameter inside the bore.

One constraint on the utilisation of the full diameter of the bore is the need for an r.f. excitation coil 7. For imaging the whole body, typically a body coil such as a birdcage coil would be used, and this must be located inside the bore 4 (rather than in the casing 5 surrounding the bore) since its effectiveness decreases the further it is positioned from the patient. In cases where part only of the body e.g. the head, is being imaged, other types of excitation coil may be used, but a coil such as a body coil is needed when it is desired to image the full length, or at least a substantial length, of the body.

One of the cases when it is necessary to image the full length, or at least a substantial length, of the body is in the case of continuous scanning, to which this invention is particularly applicable.

In a continuous scan, a patient is moved through the bore while image data is obtained from a relatively small volume of good quality magnetic field near to or at the centre of the bore. In principle, it is possible to scan a subject from head to toe.

Thus, in the case of continuous scan, the simplest arrangement is to use a whole body transmit coil 7 located in the bore of the machine, and to use this coil for receiving r.f. signals as well. There are, however, problems with this arrangement. Firstly, the r.f. coil 7 takes up significant space in the bore 4 of the magnet, and this restricts the possibility of shifting the patient laterally to optimise scanning the regions offset from the centre of the body. To scan such offset regions, it would be desirable to place them in the centre of the field. Another problem is that large whole body coils have unnecessarily large volumes of r.f. field with field leaking out from the magnet bore during transmission, and consequent excitation of regions of the body from which signal is not sought, causing aliasing. Also, the large r.f. coil is sensitive to unwanted regions of the body therefore causing additional coil noise and loading. Further, a whole body coil is poorly coupled to the body when receiving MR signals with consequent loss of signal-to-noise ratio.

It has been proposed to make the body coil 7 elliptical to get better coupling, but then this makes it more difficult to slide the patient through.

For receive purposes, surface coils (which may be flexible), and are placed on the surface of the body have been proposed, as have arrays of coils, but these are not suitable for transmit purposes. From a receive point of view, field sensitivity is not all that important, and can be corrected for. Transmitter pulses require simple and accurate fields if signal contrast is to be controlled, generating parts of a flip from components of an array.

SUMMARY

The invention provides a magnetic resonance imaging apparatus comprising a magnet having a bore into which a patient support can be introduced, an r.f. coil for transmitting r.f. signals, wherein the r.f. coil is secured to the patient support so as to be moveable with the patient support along the bore, the r.f. coil extends part way around the axis of the bore in order to partly surround the patient while allowing access to the patient support, and at least a part of the r.f. coil being displaceable laterally with respect to the bore to permit imaging of different regions of the body.

This permits imaging to be carried out with the patient shifted laterally in the magnet bore as well as allowing better localisation of the r.f. field generated to be achieved.

The invention also provides a magnetic resonance imaging apparatus comprising a magnet having a bore into which a patient support can be introduced, an r.f. coil for transmitting r.f. signals, wherein the r.f. coil is secured to the patient support so as to be moveable with the patient support along the bore, the r.f. coil extends part way around the axis of the bore in order to partly surround the patient while allowing access to the patient support, the r.f. coil including an array of coils extending in a direction around the patient, and the width of one of the coils is adjustable in a lateral direction with respect to the bore.

Ways of carrying out the invention will now be described in detail, by way of example, with reference to the accompanying drawings, in which:

DRAWINGS

Like reference numerals will be given to like parts throughout all the figures.

DESCRIPTION

Figure 1:
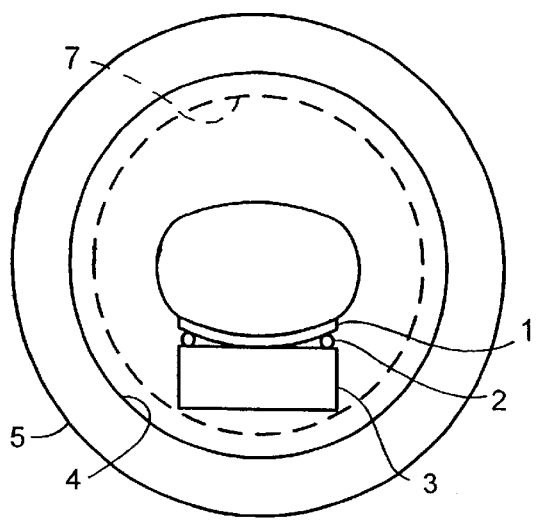
FIG. 1 is a diagrammatic cross-sectional view of known magnetic resonance imaging apparatus.

In the first and second forms of magnetic resonance imaging apparatus according to the invention, only the internal bore 4 of the magnet is shown, together with the beam 3 for supporting a patient support 1 on runners 2, together with the r.f. coil indicated generally by the reference numeral 7.

The main magnet may be resistive, but is more likely to be superconducting. Using processing means (not shown) an r.f. pulse sequence is generated by the r.f. coil 7 to excite resonance (in the presence of a main magnetic field and magnetic field gradients) in a region such as a slice of the patient (not shown), and the resulting r.f. relaxation signals are picked up by the r.f. coil 7. Using magnetic field gradients during the reception of the r.f. signals generated by MR active nuclei in the patient, and by means of digital processing in the processing means, an image of a desired region of the patient is built up.

Figure 2:
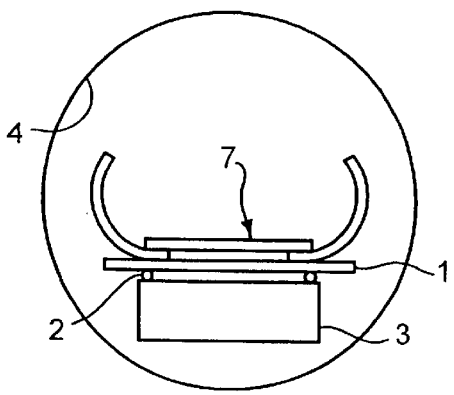
FIG. 2 is a diagrammatic cross-sectional view of a first form of magnetic resonance imaging apparatus according to the invention.
Figure 3:
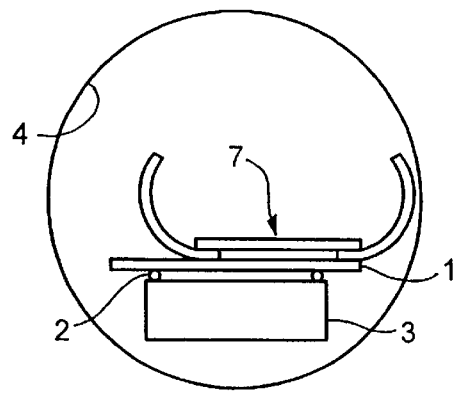
FIG. 3 is a diagrammatic cross-sectional view of the magnetic resonance imaging apparatus of FIG. 2, but with the r.f. coil laterally displaced from the position shown in FIG. 2.
Figure 4:
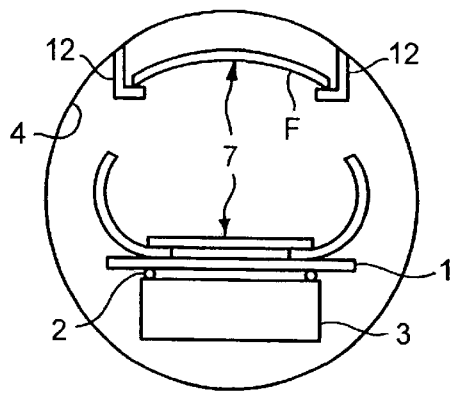
FIG. 4 is a diagrammatic cross-sectional view of a second form of magnetic resonance imaging apparatus.
Figure 5:
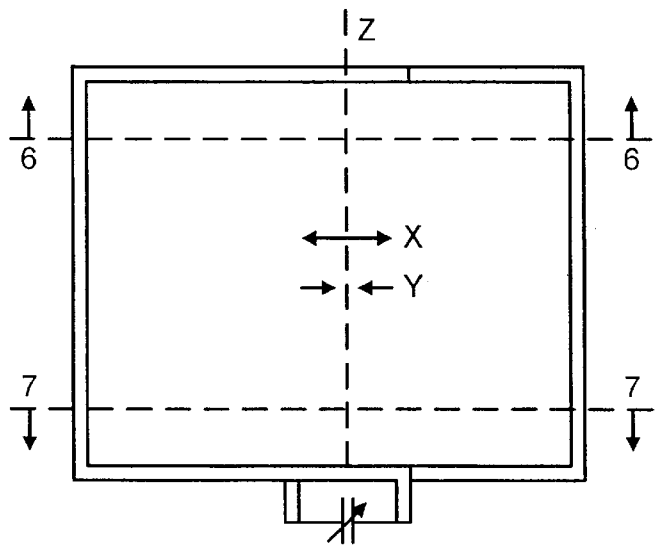
FIG. 5 is a plan view of one of the coils of the magnetic resonance imaging apparatus shown in FIG. 2.

The apparatus shown in FIGS. 2, 3 and 4 is particularly suited to continuous scanning i.e. where a volumetric region of a patient is imaged by translating the region of the patient in question axially relative to the bore 4, so that the region to be imaged passes bit by bit through the relatively confined volume of magnetic field uniform enough to permit accurate imaging to be performed.

In the known magnetic resonance imaging apparatus shown in FIG. 1, the r.f. coil 7 is fixed relative to the magnet bore. In the magnetic resonance imaging apparatus of the invention, however, the r.f. coil 7 is secured to the patient support in such a way that when the patient support is moved axially relative to the bore, the r.f. coil also moves axially with the support.

The r.f. coil is also moveable laterally, as shown in FIG. 3. Thus, with the r.f. coil positioned centrally as shown in FIG. 2, a central region of a patient, such as the spine, may be imaged, but with the r.f. coil offset as shown in FIG. 3, an offset region of the patient e.g. a region of one lung, may be imaged.

Figure 8:
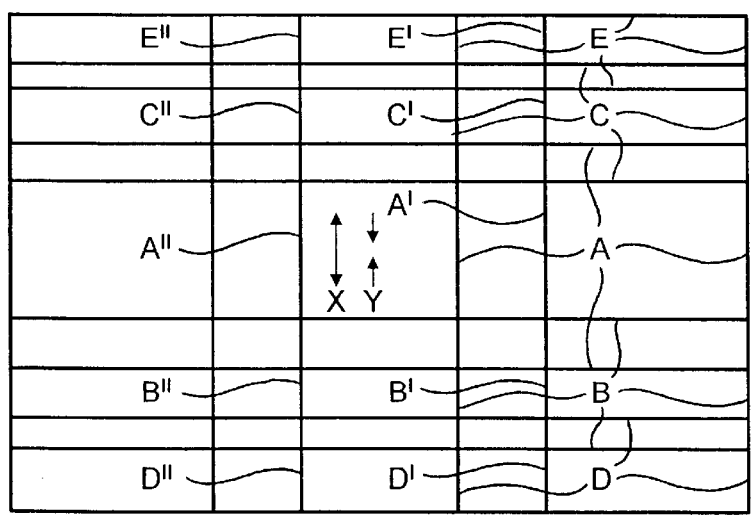
FIG. 8 is a plan view of the r.f. coil array of the magnetic resonance imaging apparatus as shown in FIG. 2 and FIG. 9, but with the array unwrapped into a planar arrangement.

The coil form proposed is shown in FIGS. 2, 3, 8 and 9. The r.f. coil is an array in two dimensions (FIG. 8 shows the array notionally opened into a planar configuration). This array is then folded at the sides so that its shape replicates that of the machine bore. In other words, the radius of curvature of the sides of the r.f. coil 7 is approximately the same as that as that of the bore. This makes it easier to displace the r.f. coil close to the side of the bore 4.

The r.f. coil array 7 has five sections A to E in a circumferential direction extending around the axis of the bore i.e. the direction in which it partly surrounds the patient. This is shown more clearly in FIG. 9, which is an enlarged view of the r.f. coil of FIGS. 2 and 3. The r.f. coil array 7 has three sections along the patient bed, and these are seen best from FIG. 8.

Figure 9:
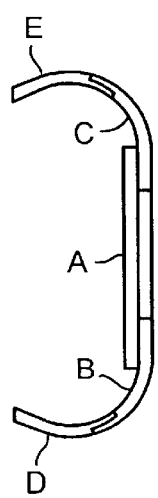
FIG. 9 is an enlarged view of the coil array of the magnetic resonance imaging apparatus shown in FIG. 2.

It will be noted from FIG. 9 that coil A overlaps coils C and B, and coils C and B in turn overlap coils E and D. This overlap also happens along the length of the bed, where further sections A' to E' and A" to E" are provided, and the individual coils of the section A' to E' overlap the adjacent coils in the sections A to E and A" to E".

Thus, it will be seen that there is overlap both along the direction of the bed and in the direction surrounding the patient, the purpose being to minimise mutual coupling between the coils (NMR Phased Array by P B Roemer, W A Edelstein, C E Hayes, S P Souza and O M Mueler published by Magnetic Resonance in Medicine Volume 16, pages 192 to 225 (1990)). All four sides of the coils A to E have been indicated in FIG. 8.

In addition to the coil array 7 being laterally displaceable as shown in FIG. 3, the lateral width of the central section of the coil array i.e. the sections A, A' and A" may be increased or decreased, shown symbolically by the arrows X,Y.

Figure 6:
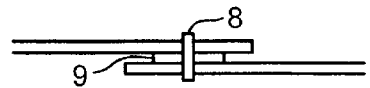
FIG. 6 is a section taken through the lines 6—6 of FIG. 5.
Figure 7:
FIG. 7 is a section taken through the lines 7—7 of FIG. 5.

Thus, the pairs of coils B,D and C,E etc. can be pulled apart or closed together to match the patient's size. The slack is taken up by varying the size of coils A, A', A". The side arms, as can be seen from FIGS. 6 and 7, can be slid across each other. At one end this is metal to metal contact. At the other end there is insulation across which an adjustable tuning capacitor is placed. For the metal to metal contact, a clamp 8 secures a conducting pad 9 e.g. of wire mesh between the ends. At the other end, an insulating clamp 10 clamps the ends together with an insulator 11 sandwiched between.

Coil A, in common with the other coils, can be multi-turn. In the case of coil A all the overlaps are metal to metal except the one at the end.

Although the coils A, A' and A" are shown as being infinitely variable, in practice a small number of fixed locations are preferable from an engineering point of view. Note that the expansion and reduction of the coils A takes place about the centre line Z,Z, so as to keep the coupling to the coils B,C correct as the coil array size is changed.

All the coils of the array are terminated in tuning capacitors, and the signals are fed individually to the processing system.

FIG. 2 shows a patient in the coil array 7, centrally positioned, and FIG. 3 shows the patient as far over to one side as possible while retaining full use of the coil. If it is desired to move the patient further still to one side, it is possible to remove one or two sections of a coil, for example sections C and E.

The second form of magnetic resonance imaging apparatus shown in FIG. 4 is the same as the first shown with respect to FIGS. 2, 3 and 5 to 9, except that an additional demountable section of transmitter coil F is mounted on supports 12 from the roof of the bore. This additional coil section F can co-operate with the coil below and help improve field homogeneity, particularly towards the top of the body. However, there is only one section of roof coil, not three sections as for the coil beneath the patient.

The coil arrays 7 described are used for both transmit and receive, although in principle a separate receive coil e.g. a surface coil could be employed.

Among advantages of the illustrated arrangement according to the invention is that off axis regions of a patient may be readily imaged in continuous scan since the coil array can be displaced sideways and since the curvature of the end of the array conforms to that of the bore. The coil can accommodate patients of different sizes because of the adjustable central section and, since the coil moves along the length of the bore with the patient support, the coil can be brought closer to the patient than would be the case if there was relative movement between the coil and the patient as in the known arrangement of FIG. 1.

Padding could be included on top of the coil array for comfort and cosmetic reasons.

Of course, variations may be made without departing from the scope of the invention. Thus, there may be more or less sections both along the length of the patient and around the patient. In the imaging apparatus described, the coil array has been described as being moveable relative to the patient support 1 in a lateral direction. Of course the patient support itself could also be moveable laterally instead, in which case the relative lateral movement would be between the patient support 1 and the runners 2. A more complicated mechanism for the runners would then be required, in order to also accommodate the axial movement.

The coil array is rigid, but could be made to possess a slight springiness if desired.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

I claim:

1. A magnetic resonance imaging apparatus comprising a magnet having a bore, a patient support moveable along the bore, and an r.f. coil secured to the patient support so as to be moveable with the patient support along the bore, at least a part of the secured r.f. coil being displaceable laterally with respect to the bore while a patient is disposed within the bore and is supported by the patient support to permit continuous imaging of different lateral regions of the patient.

2. A magnetic resonance imaging apparatus as claimed in claim 1, wherein the bore has an axis and where the r.f. coil extends part way around the axis in order to partly surround the patient while allowing access to the patient support.

3. A magnetic resonance imaging apparatus as claimed in claim 1, in which the r.f. coil includes an array of coils extending in a direction around the patient.

4. A magnetic resonance imaging apparatus as claimed in claim 3, in which the width of a coil in the array of coils is adjustable in a lateral direction with respect to the bore.

5. A magnetic resonance imaging apparatus as claimed in claim 4, in which the adjustable width coil includes two overlapping coil portions.

6. A magnetic resonance imaging apparatus as claimed in claim 3, in which the array of coils extends along the patient support in an axial direction.

7. A magnetic resonance imaging apparatus as claimed in claim 1, including a coil section removably mounted to the bore to co-operate with the r.f. coil.

8. A magnetic resonance imaging apparatus comprising a magnet having a bore, a patient support moveable along the bore, and an r.f. coil secured to the patient support so as to be moveable with the patient support along the bore, the secured r.f. coil including an array of coils extending in a direction around a patient, and the width of a coil in the array of coils is adjustable in a lateral direction with respect to the bore while the patient is supported by the patient support in the bore.

9. A magnetic resonance imaging apparatus as claimed in claim 8, in which the r.f. coil extends part way around the axis of the bore in order to partly surround the patient while allowing access to the patient support.

10. A magnetic resonance imaging apparatus as claimed in claim 8, in which the adjustable width coil includes two overlapping coil portions.

11. A magnetic resonance imaging apparatus as claimed in claim 8, in which the array of coils also extends along the patient support in an axial direction.

12. A magnetic resonance imaging apparatus as claimed in claim 8 wherein at least a part of the r.f. coil is displaceable laterally with respect to the bore to permit imaging of different regions of the body.

13. A magnetic resonance imaging apparatus as claimed in claim 8, further including a coil section detachably mounted to the bore to co-operate with the r.f. coil.

14. A magnetic resonance imaging apparatus as claimed in claim 8 wherein the array of coils includes lateral sides which are curved to match the curvature of the bore.

15. A magnetic resonance imaging apparatus for imaging an object comprising a magnet which generates a main magnetic field in an imaging region;

an object support movable axially with respect to the imaging region;

an r.f. coil secured to the object support and movable axially with the object support and laterally, while the object is supported by the object support within the bore to at least a first lateral position in relation to the imaging region for imaging a central region of the object and a second lateral position for imaging an offset region of the object to permit continuous imaging of the central and offset regions of the object.

16. A magnetic resonance imaging apparatus as claimed in claim 15, in which the r.f. coil includes an array of coils which partly surround the object while allowing access to the object support.

17. A magnetic resonance imaging apparatus as claimed in claim 16, in which the array of coils is made up of at least five coils in a lateral direction with respect to the object support and at least three coils in a direction along the object support.

18. A magnetic resonance imaging apparatus as claimed in claim 16, in which the width of a coil in the array of coils is adjustable in a lateral direction with respect to the object support.

19. A magnetic resonance imaging apparatus as claimed in claim 16, wherein adjacent coils in the array of coils overlap.

20. A magnetic resonance imaging apparatus as claimed in claim 15, wherein the r.f. coil is adjustable to the size of the object of interest.

* * * * *